United States Patent
Reid et al.

(10) Patent No.: US 10,276,795 B2
(45) Date of Patent: Apr. 30, 2019

(54) FABRICATION OF CORRELATED ELECTRON MATERIAL FILM VIA EXPOSURE TO ULTRAVIOLET ENERGY

(71) Applicant: ARM Ltd., Cambridge (GB)

(72) Inventors: Kimberly Gay Reid, Austin, TX (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/237,357

(22) Filed: Aug. 15, 2016

(65) Prior Publication Data

US 2018/0047897 A1 Feb. 15, 2018

(51) Int. Cl.
| | | |
|---|---|---|
| *H01L 45/00* | (2006.01) | |
| *C23C 16/455* | (2006.01) | |
| *C23C 16/48* | (2006.01) | |

(52) U.S. Cl.
CPC .... *H01L 45/1608* (2013.01); *C23C 16/45527* (2013.01); *C23C 16/482* (2013.01); *H01L 45/1233* (2013.01); *H01L 45/146* (2013.01); *H01L 45/1616* (2013.01)

(58) Field of Classification Search
CPC ............. H01L 45/1608; H01L 45/1616; H01L 45/146; H01L 45/147; H01L 45/1641; H01L 45/1658; H01L 45/1233; C23C 16/45527; C23C 16/482
See application file for complete search history.

(56) References Cited

U.S. PATENT DOCUMENTS

| | | | | |
|---|---|---|---|---|
| 5,138,520 A | * | 8/1992 | McMillan | ........... C23C 16/4412 257/E21.01 |
| 6,511,718 B1 | * | 1/2003 | Paz de Araujo | ....... B05D 1/007 257/E21.009 |
| 6,787,181 B2 | * | 9/2004 | Uchiyama | ............... C23C 16/40 257/E21.009 |
| 7,298,640 B2 | | 11/2007 | Chen et al. | |
| 7,639,523 B2 | | 12/2009 | Celinska et al. | |
| 7,674,399 B2 | * | 3/2010 | Ando | ................. C09K 11/7701 252/301.4 R |
| 7,778,063 B2 | | 8/2010 | Brubaker et al. | |
| 7,872,900 B2 | | 1/2011 | Paz de Araujo et al. | |
| 9,246,099 B1 | * | 1/2016 | Hsueh | ............... C23C 16/45544 |
| 9,514,814 B1 | | 12/2016 | Sandhu et al. | |
| 9,548,118 B1 | | 1/2017 | Bhavnagarwala et al. | |
| 9,558,819 B1 | | 1/2017 | Aitken et al. | |

(Continued)

OTHER PUBLICATIONS

Invitation to Pay Additional Fees and, Where Applicable, Protest Fee & Partial International Search Report, App. No. PCT/GB2017/052367, dated Nov. 16, 2017, 20 Pages.

(Continued)

*Primary Examiner* — Michael M Trinh
(74) *Attorney, Agent, or Firm* — Berkeley Law & Technology Group, LLP

(57) ABSTRACT

Subject matter disclosed herein may relate to fabrication of correlated electron materials used, for example, to perform a switching function. In embodiments, processes are described, in which an ultraviolet light source is utilized during fabrication of a correlated electron material. In embodiments, use of ultraviolet light may decrease a likelihood of diffusion of atomic and/or molecular components of a substrate that may bring about undesirable electrical performance of a CEM device.

21 Claims, 6 Drawing Sheets

(56) References Cited

U.S. PATENT DOCUMENTS

| | | | |
|---|---|---|---|
| 9,584,118 B1 | 2/2017 | Dao et al. | |
| 9,589,636 B1 | 3/2017 | Bhavnagarwala et al. | |
| 9,621,161 B1 | 4/2017 | Das et al. | |
| 9,627,615 B1 | 4/2017 | Reid et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren | |
| 9,747,982 B1 | 8/2017 | Shifren et al. | |
| 9,748,943 B2 | 8/2017 | Sandhu et al. | |
| 9,755,146 B2 | 9/2017 | Shifren et al. | |
| 9,773,550 B2 | 9/2017 | Bhavnagarwala et al. | |
| 9,786,370 B2 | 10/2017 | Aitken et al. | |
| 9,792,982 B1 | 10/2017 | Sandhu | |
| 9,792,984 B1 | 10/2017 | Bhavnagarwala et al. | |
| 9,805,777 B2 | 10/2017 | Sandhu et al. | |
| 9,851,738 B2 | 12/2017 | Sandhu et al. | |
| 9,871,528 B1 | 1/2018 | Kumar et al. | |
| 9,899,083 B1 | 2/2018 | Rosendale | |
| 9,947,402 B1 | 4/2018 | Bhavnagarwala et al. | |
| 9,972,388 B2 | 5/2018 | Das et al. | |
| 9,978,942 B2 | 5/2018 | Shifren et al. | |
| 9,979,385 B2 | 5/2018 | Sandhu et al. | |
| 9,990,992 B2 | 6/2018 | Bhavnagarwala et al. | |
| 9,997,424 B2 | 6/2018 | Arvin et al. | |
| 10,002,665 B1 | 6/2018 | Bhargava et al. | |
| 10,002,669 B1 | 6/2018 | Bhargava et al. | |
| 10,032,487 B2 | 7/2018 | Shifren et al. | |
| 2008/0106925 A1* | 5/2008 | Paz de Araujo | H01L 45/04 365/148 |
| 2008/0106926 A1 | 5/2008 | Brubaker | |
| 2008/0107801 A1 | 5/2008 | Celinska et al. | |
| 2009/0296451 A1* | 12/2009 | Asao | G11C 13/0002 365/148 |
| 2012/0132934 A1* | 5/2012 | Ohuchi | H01L 51/5088 257/88 |
| 2012/0270393 A1* | 10/2012 | Pore | C23C 16/06 438/658 |
| 2013/0056851 A1 | 3/2013 | Hanhong et al. | |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2015/0086729 A1 | 3/2015 | Gortzen et al. | |
| 2016/0163978 A1* | 6/2016 | Paz de Araujo | H01L 45/1608 257/4 |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0069378 A1 | 3/2017 | Shifren et al. | |
| 2017/0092858 A1 | 3/2017 | Shifren | |
| 2017/0147207 A1 | 5/2017 | Hansson et al. | |
| 2017/0244027 A1 | 8/2017 | Reid et al. | |
| 2017/0244032 A1 | 8/2017 | Reid et al. | |
| 2017/0288675 A1 | 10/2017 | Chandra et al. | |
| 2018/0095114 A1 | 4/2018 | Bhargave et al. | |

OTHER PUBLICATIONS

Buono, et al, "Nickel B-diketonate complexes as precursors for the photochemical deposition of nickel oxide thin films," Journal of Materials Science 35, 2000, pp. 4873-4877.

Chalker, "Photochemical atomic layer deposition and etching," Surface & Coatings Technology 291, Elsevier, www.elsevier.com/locate/surfcoat, 2016, pp. 258-263.

Notification of Transmittal of the International Search Report and the Written Opinion of the International Searching Authority, or the Declaration, dated Jan. 15, 2018, International Application No. PCT/GB2017/052367, 1 pg.

The International Search Report, dated Jan. 15, 2018, International Application No. PCT/GB2017/052367, 7 pgs.

The Written Opinion of the International Searching Authority, dated Jan. 15, 2018, International Application No. PCT/GB2017/052367, 15 pgs.

Buono-Core G E et. al., "Nickel [beta]-diketonate complexes as precursors for the photochemical deposition of nickel oxide thin films", Journal of Materials Science Kluwer Academic Publishers USA, vol. 35, No. 19, Oct. 1, 2000 , pp. 4873-4877.

Chalker, P R, "Photochemical atomic layer deposition and etching", Surface and Coatings Technology, Elsevier BV, Amsterdam, NL, vol. 291, Feb. 24, 2016, pp. 258-263.

Notification Concerning Transmittal of Copy of International Preliminary Report on Patentability (Chapter 1 of the Patent Cooperation Treaty), International Application No. PCT/GB2017/052367, dated Feb. 28, 2019, 1 pg.

International Preliminary Report on Patentability, International Application No. PCT/GB2017/052367, dated Feb. 28, 2019, 13 pgs.

* cited by examiner

FABRICATION OF CORRELATED ELECTRON MATERIAL FILM VIA EXPOSURE TO ULTRAVIOLET ENERGY

BACKGROUND

Field

This disclosure relates to correlated electron devices, and may relate, more particularly, to approaches toward fabricating correlated electron devices, such as may be used in switches, memory circuits, and so forth, which may exhibit desirable impedance characteristics.

Information

Integrated circuit devices, such as electronic switching devices, for example, may be found in a wide range of electronic device types. For example, memory and/or logic devices may incorporate electronic switches suitable for use in computers, digital cameras, smart phones, tablet devices, personal digital assistants, and so forth. Factors that relate to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed. However, conventional fabrication techniques, which may be well suited for certain types of memory and/or logic devices, may not be entirely suitable for use in fabricating devices that utilize correlated electron materials.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
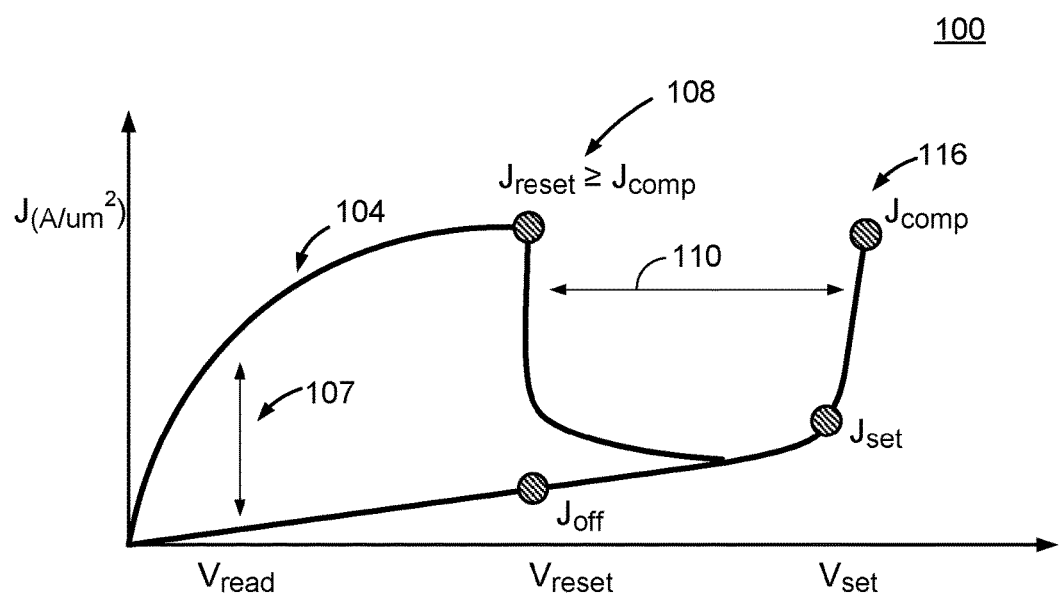
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM) in memory and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects. In this context, a CEM switch, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3}a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM device may comprise one or more materials selected from a group comprising aluminum, cadmium, chromium, cobalt, copper, gold, iron, manganese, mercury, molybdenum, nickel, palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect.

FIG. 1A is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ may bring about a transition of the CEM device to a relatively high-impedance memory state. As shown in FIG. 1A, reference designator 110 illustrates the voltage range that may separate $V_{set}$ from $V_{reset}$. Following placement of the CEM device into a high-impedance state or a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, titanium yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, the CEM device of FIG. 1A may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, which may establish and/or stabilize variable impedance properties. Thus, in another particular example, NiO doped with extrinsic ligands may be expressed as NiO:$L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), Fluoride (F), Chloride (Cl), Bromide (Br), cyanide (CN), sulfur (S) and others.

In another embodiment, the CEM device of FIG. 1A may comprise other transition metal oxide variable impedance materials, such as nitrogen-containing ligands, though it should be understood that these are exemplary only and are not intended to limit claimed subject matter. Nickel oxide (NiO) is disclosed as one particular TMO. NiO materials discussed herein may be doped with extrinsic nitrogen-containing ligands, which may stabilize variable impedance properties. In particular, NiO variable impedance materials disclosed herein may include nitrogen-containing molecules of the form $C_xH_yN_z$ (wherein x≥0, y≥0, z≥0, and wherein at least x, y, or z comprise values >0) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO variable impedance materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally-applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In which $A_{CEM}$ is a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

Figure 1B:
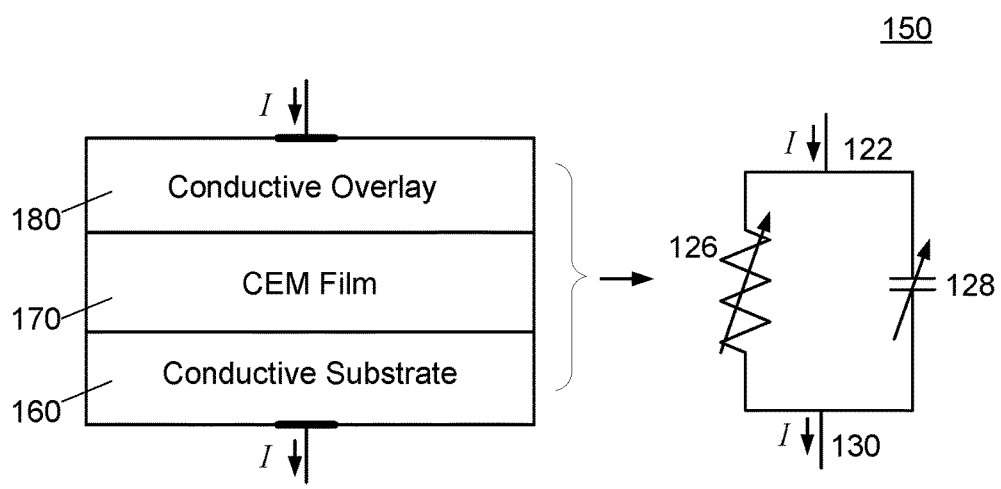
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as a device comprising a conductive substrate 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In an embodiment, Table 1 shows that a resistance of a variable impedance device, such as the device of embodiment 150, may transition between a low-impedance state and a substantially dissimilar, high-impedance state as a function at least partially dependent on a voltage applied across the CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across the CEM device.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal compound, transition metal oxide, or comprising a combination thereof. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:NH$_3$), thereby permitting the nickel oxide material to switch to exhibiting a substantially dissimilar impedance property, such as a high-impedance property, during device operation.

Thus, in this context, a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+ (e.g., Ni$^{2+}$ in a material, such as NiO:CO or NiO:NH$_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reaction, substantially in accordance with expression (4), below:

$$2Ni^{2+} \rightarrow Ni^{1+} + Ni^{3+} \qquad (4)$$

Such disproportionation, in this instance, refers to formation of nickel ions as Ni$^{1+}$+Ni$^{3+}$ as shown in expression (4), which may bring about, for example, a relatively high-impedance state during operation of the CEM device. In an embodiment, a "dopant" such as a carbon-containing ligand, carbonyl (CO) or a nitrogen-containing ligand, such as an ammonia molecule (NH$_3$), may permit sharing of electrons during operation of the CEM device so as to give rise to the disproportionation reaction of expression (4), and its reversal, substantially in accordance with expression (5), below:

$$Ni^{1+} + Ni^{3+} \rightarrow 2Ni^{2+} \qquad (5)$$

As previously mentioned, reversal of the disproportionation reaction, as shown in expression (5), permits nickel-based CEM to return to a relatively low-impedance state In embodiments, depending on a molecular concentration of NiO:CO or NiO:NH$_3$, for example, which may vary from values approximately in the range of an atomic percentage of 0.1% to 10.0%, V$_{reset}$ and V$_{set}$, as shown in FIG. 1A, may vary approximately in the range of 0.1 V to 10.0 V subject to the condition that V$_{set}$≥V$_{reset}$. For example, in one possible embodiment, V$_{reset}$ may occur at a voltage approximately in the range of 0.1 V to 1.0 V, and V$_{set}$ may occur at a voltage approximately in the range of 1.0 V to 2.0 V, for example. It should be noted, however, that variations in V$_{set}$ and V$_{reset}$ may occur based, at least in part, on a variety of factors, such as atomic concentration of a back-donating material, such as NiO:CO or NiO:NH$_3$ and other materials present in the CEM device, as well as other process variations, and claimed subject matter is not limited in this respect.

In certain embodiments, atomic layer deposition may be utilized to form or to fabricate films comprising NiO materials, such as NiO:CO or NiO:NH$_3$, to permit electron back-donation during operation of the CEM device in a circuit envirocheent, for example, to give rise to a low-impedance state. Also during operation in a circuit environment, for example, electron back-donation may be reversed so as to give rise to a substantially dissimilar impedance state, such as a high-impedance state, for example. In particular embodiments, atomic layer deposition may utilize two or more precursors to deposit components of, for example, NiO:CO or NiO:NH$_3$, or other transition metal oxide, transition metal, or combination thereof, onto a conductive substrate. In an embodiment, layers of a CEM device may be deposited utilizing separate precursor molecules, AX and BY, according to expression (6a), below:

$$AX_{(gas)} + BY_{(gas)} = AB_{(solid)} + XY_{(gas)} \qquad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compound, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO$_3$).

In embodiments, "X" of expression (6a) may comprise a ligand, such as organic ligand, comprising amidinate (AMD), dicyclopentadienyl (Cp)$_2$, diethylcyclopentadienyl (EtCp)$_2$, Bis(2,2,6,6-tetramethylheptane-3,5-dionato) ((thd)$_2$), acetylacetonate (acac), bis(methylcyclopentadienyl) ((CH$_3$C$_5$H$_4$)$_2$), dimethylglyoximate (dmg)$_2$, 2-amino-pent-2-en-4-onato (apo)$_2$, (dmamb)$_2$ where dmamb=1-dimethylamino-2-methyl-2-butanolate, (dmamp)2 where dmamp=1-dimethylamino-2-methyl-2-propanolate, Bis (pentamethylcyclopentadienyl) (C$_5$(CH$_3$)$_5$)$_2$ and carbonyl (CO)$_4$. Accordingly, in some embodiments, nickel-based precursor AX may comprise, for example, nickel amidinate (Ni(AMD)), nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni (CH$_3$C$_5$H$_4$)$_2$, Nickel dimethylglyoximate (Ni(dmg)$_2$), Nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, Bis(pentamethylcyclopentadienyl) nickel (Ni (C$_5$(CH$_3$)$_5$)$_2$, and nickel carbonyl (Ni(CO)$_4$), just to name a few examples. In expression (6a), precursor "BY" may comprise an oxidizer, such as oxygen (O$_2$), ozone (O$_3$), nitric oxide (NO), hydrogen peroxide (H$_2$O$_2$), just to name a few examples. In other embodiments as will be described further herein, plasma may be used with an oxidizer to form oxygen radicals.

However, in particular embodiments, a dopant comprising a back-donating material in addition to precursors AX and BY may be utilized to form layers of the CEM device. An additional dopant ligand comprising a back-donating material, which may co-flow with precursor AX, may permit formation of back-donating compounds, substantially in accordance with expression (6b), below. In embodiments, a dopant comprising a back-donating material, such as ammonia (NH$_3$), methane (CH$_4$), carbon monoxide (CO), or other material may be utilized, as may other ligands comprising carbon or nitrogen or other dopants comprising back-donating materials listed above. Thus, expression (6a) may be modified to include an additional dopant ligand comprising a back-donating material substantially in accordance with expression (6b), below:

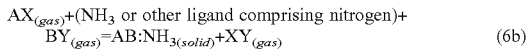

$$AX_{(gas)}+(NH_3 \text{ or other ligand comprising nitrogen})+ BY_{(gas)}=AB:NH_{3(solid)}+XY_{(gas)} \quad (6b)$$

It should be noted that concentrations, such as atomic concentration, of precursors, such as AX, BY, and NH$_3$ (or other ligand comprising nitrogen) of expressions (6a) and (6b) may be adjusted so as to bring about a final atomic concentration of nitrogen or carbon dopant comprising a back-donating material in a fabricated CEM device, such as in the form of ammonia (NH$_3$) or carbonyl (CO) comprising a concentration of between approximately 0.1% and 10.0%. However, claimed subject matter is not necessarily limited to the above-identified precursors and/or atomic concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition or the like, utilized in fabrication of CEM devices. In expressions (6a) and (6b), "BY" may comprise an oxidizer, such as oxygen (O$_2$), ozone (O$_3$), nitric oxide (NO), hydrogen peroxide (H$_2$O$_2$), just to name a few examples. In other embodiments, plasma may be used with an oxidizer (BY) to form oxygen radicals. Likewise, plasma may be used with the doping species comprising a back-donating material to form an activated species to control the doping concentration of the CEM.

In particular embodiments, such as embodiments utilizing atomic layer deposition, a substrate may be exposed to precursors, such as AX and BY, as well as dopants comprising back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:NH$_3$, for example, is performed, chamber temperature ranges approximately in the range of 20.0° C. and 400.0° C. may be utilized. Responsive to exposure to precursor gases (e.g., AX, BY, NH$_3$, or other ligand comprising nitrogen), such gases may be purged from the heated chamber for durations approximately in the range of 0.5 seconds to 180.0 seconds. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression 6(a)) or a single three-precursor cycle (e.g., AX, NH$_3$, CH$_4$, or other ligand comprising nitrogen, carbon or other dopant comprising a back-donating material, and BY, as described with reference to expression 6(b)) utilizing atomic layer deposition may bring about a CEM device layer comprising a thickness approximately in the range of 0.6 Å to 5.0 Å per cycle). Accordingly, in an embodiment, to form a CEM device film comprising a thickness of approximately 500.0 Å utilizing an atomic layer deposition process in which layers comprise a thickness of approximately 0.6 Å, 800-900 cycles, for example, may be utilized. In another embodiment, utilizing an atomic layer deposition process in which layers comprise approximately 5.0 Å, 100 two-precursor cycles, for example. It should be noted that atomic layer deposition may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles (e.g., AX and BY), or three-precursor cycles (AX, NH$_3$, CH$_4$ or other ligand comprising nitrogen, carbon or other dopant comprising a back-donating material and BY), of atomic layer deposition, a CEM device film may undergo in situ annealing, which may permit improvement of film properties or may be used to incorporate the dopant comprising a back-donating material, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing chamber temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, V$_{reset}$ may occur at a voltage approximately in the range of 0.1 V to 1.0 V, and V$_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

Figure 2A:
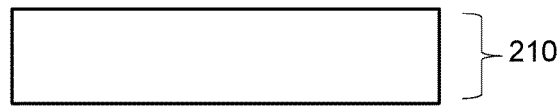
FIG. 2A is an illustration of an embodiment of a conductive substrate.

FIG. 2A is an illustration of an embodiment of a conductive substrate 200. A conductive substrate, such as conductive substrate 210, for example, may comprise a titanium-based and/or titanium-containing substrate, such as titanium nitride (TiN), fabricated in layers, for example, for use in a CERAM switching device or other type of CEM-based device. In other embodiments, conductive substrate 210 may comprise other types of conductive materials, such as titanium nitride, platinum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof, and claimed subject matter is not limited to any particular composition of conductive substrate material.

In other embodiments, conductive substrate 210 may comprise a tantalum-based and/or a tantalum-containing material, such as tantalum nitride (TaN), formed in layers, for use in a CERAM device or other type of CEM-based device. In embodiments, a TaN substrate may be formed utilizing precursors such as pentakisdimethylamido tantalum (PDMAT), which may comprise carbon as a dopant species. In another embodiment, a TaN substrate may be formed utilizing tantalum ethoxide (TAETO), which may also comprise carbon as a dopant species. In another embodiment, a TaN substrate may be formed utilizing tantalum pentachloride ($TaCl_5$), which may comprise chlorine as a dopant species.

In other embodiments, conductive substrate 210 may comprise a tungsten-based and/or a tungsten-containing material formed in layers, such as tungsten-nitride (WN), for example, for use in a CERAM device or other type of CEM-based device. In embodiments, a WN substrate may be formed utilizing precursors such as tungsten hexacarbonyl ($W(CO)_6$) and/or cyclopentadienyltungsten(II) tricarbonyl hydride, both of which may comprise carbon as a dopant species. In another embodiment, a WN substrate may be formed utilizing triamminetungsten tricarbonyl (($NH_3$)3 $W(CO)_3$) and/or tungsten pentacarbonyl methylbutylisonitrile ($W(CO)5(C_5H_{11}NC)$), both of which may comprise carbon or nitrogen as a dopant species.

Figure 2B:
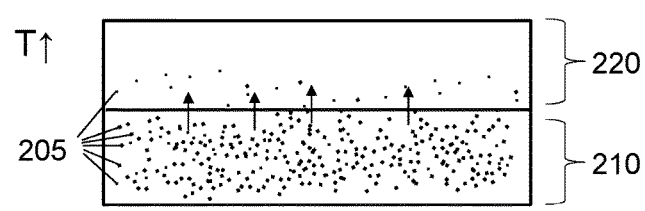
FIG. 2B is an illustration of the conductive substrate embodiment of FIG. 2A showing atomic and/or molecular components of the conductive substrate material diffusing into a correlated electron material fabricated on the conductive substrate.

FIG. 2B is an illustration of the conductive substrate embodiment (250) of FIG. 2A showing atomic and/or molecular components of the conductive substrate material diffusing into a correlated electron material fabricated the conductive substrate 210. Decomposition of conductive substrate material may be accelerated, for example, responsive to an elevated chamber temperature (as shown by the descriptor T↑ in FIG. 2B), which may be utilized during the fabrication of one or more layers of a CEM film, such as CEM film 220, deposited on conductive substrate 210. For example, as previously mentioned, if atomic layer deposition or chemical vapor deposition are utilized to form a CEM film, in which a chamber temperature approximately in the range of 20.0° C. to 500.0° C. may be achieved, such elevated chamber temperatures may bring about thermally-sensitive decomposition of molecular and/or atomic components of substrate 210. In addition, elevated chamber temperatures may bring about thermally-sensitive accelerated diffusion of atomic and/or molecular components of substrate 210 into CEM film 220. Thus, in one possible example, if substrate 210 comprises a TiN material, titanium atoms 205, or other atomic and/or molecular components of substrate 210, may diffuse or migrate from substrate 210 into CEM film 220. In another example, if substrate 210 comprises tantalum nitride, constituent atomic and/or molecular components of a tantalum nitride substrate, (e.g., atomic tantalum), may diffuse into CEM film 220. Likewise, if substrate 210 comprises tungsten nitride, atomic tungsten may diffuse from substrate 210 into CEM film 220.

In embodiments, thermally-sensitive diffusion of atomic and/or molecular components of a conductive substrate, such as titanium, tantalum, tungsten, platinum, copper, aluminum, cobalt, and so forth, may refer to a potential to bring about undesirable electrical performance, for example, of a CEM film, such as CEM film 220. In a non-limiting example just to illustrate, if titanium atoms were to diffuse into CEM film 220, for example, such diffusion may displace or inhibit retention of CEM dopant species, such as chlorine (Cl), nitrogen (N), and/or carbonyl (CO), for example. In particular embodiments, as previously described herein, dopant species (e.g., Cl, N, CO, etc.) may give rise to or enhance electron back-donation in a CEM. Also as previously described herein, electron back-donation may bring about controllable and reversible donation of electrons to a conduction band of a CEM comprising a transition metal or transition metal oxide, such as nickel, for example, during CEM operation. In turn, such controllable and reversible donation of electrons to a conduction band may bring about substantially rapid conductor-to-insulator transition of a CEM under an influence of a first applied voltage, as described in reference to FIGS. 1A-1B, and a substantially rapid insulator-two-conductor transition under an influence of a second applied voltage.

Accordingly, in particular embodiments, it may be desirable to fabricate a CEM film 220 on a conductive substrate, such as conductive substrate 210, in a manner that reduces likelihood of thermally-sensitive diffusion of atomic and/or molecular components from a conductive substrate into CEM film 220. Fabrication of CEM film 220 in a manner that reduces likelihood of diffusion of atomic and/or molecular components of substrate 210, may preserve desirable electrical properties of CEM film 220, such as substantially rapid, controllable, and reversible conductor-to-insulator transitions.

Accordingly, in particular embodiments, during fabrication of a CEM film, which may comprise a thermally-sensitive portion of a process of fabricating a CEM switch, for example, an ultraviolet light source may be utilized, which may enable CEM fabrication processes to occur without elevating a chamber temperature. Thus, in certain embodiments, which utilize an ultraviolet light source in atomic layer deposition processes or chemical vapor deposition processes, a CEM film may be fabricated utilizing a chamber temperature range approximately in the range of 100.0° C. to 150.0° C. lower than alternative processes. Accordingly, rather than utilize chamber temperatures that may approach 500.0° C., an atomic layer deposition process or a chemical vapor deposition process to fabricate a CEM film may utilize a chamber temperature approaching, for example, approximately 350.0° C. Thus, thermally-sensitive diffusion of atomic and/or molecular components from conductive substrate 210 into CEM film 220, may be reduced to a potentially negligible level, for example. Use of an ultraviolet light source during fabrication of a CEM film may bring about other advantages, and claimed subject matter is not limited in this respect.

Figure 3A:
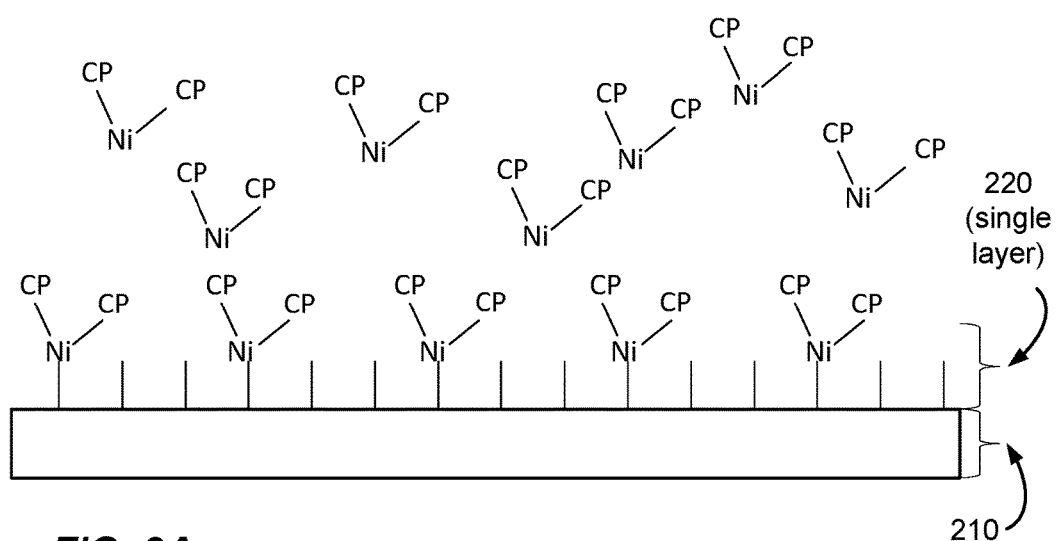
FIG. 3A-3C illustrate embodiments of sub-processes utilized in fabricating a correlated electron material on a substrate.
Figure 3B:
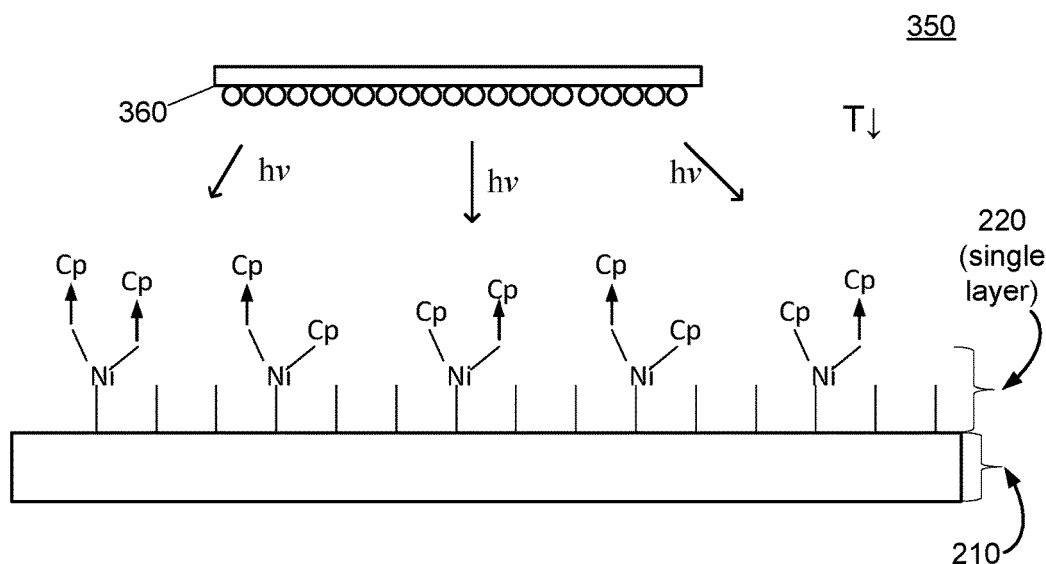
Figure 3C:
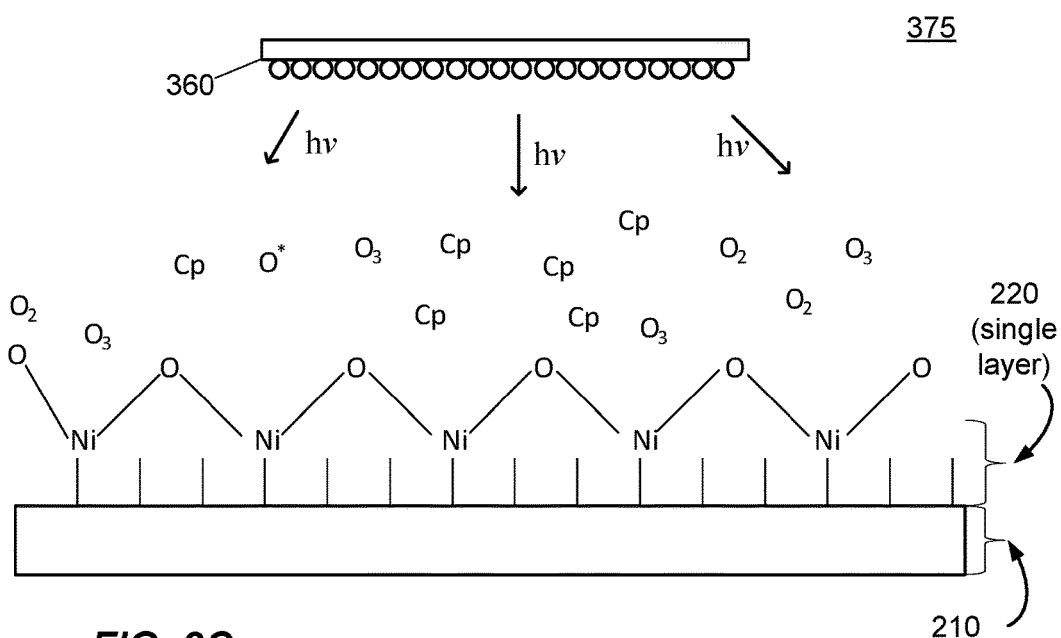

FIGS. 3A-3C are illustrations of a sub-processes utilized in methods for fabricating correlated electron materials according to an embodiments. The sub-processes of FIGS. 3A-3C may correspond, at least in part, to an atomic layer deposition process utilizing precursors AX and BY of expression (6) to deposit components of NiO:CO onto a substantially complete conductive substrate. In embodiments, a conductive substrate may comprise an electrode material comprising titanium nitride, tantalum, platinum, titanium, copper, aluminum, and so forth, as previously described herein.

As shown in FIG. 3A (embodiment 300), a correlated electron material film may be formed on a substantially completed substrate, such as substrate 210, by exposing the substrate to a first gaseous precursor, such as precursor AX of expression (6). A first gaseous precursor may comprise nickel dicyclopentadienyl ($Ni(Cp)_2$), which may be exposed to substrate for a duration of approximately in the range of 0.5 seconds to 180.0 seconds, for example. As previously described, concentration, such as atomic concentration, of a first gaseous precursor, as well as exposure time, may be adjusted so as to bring about a final atomic concentration of carbon, such as in the form of carbonyl, of between approximately 0.1% and 10.0%, for example. As shown in FIG. 3A, exposure of a substrate to gaseous $(Ni(Cp)_2)$ may result in attachment of $(Ni(Cp)_2)$ molecules or $(Ni(Cp))$ at various locations of the surface of substrate 450. Deposition may take place in a heated chamber which may attain, for example, a chamber temperature approximately in the range of 20.0° C. to 350.0° C. However, it should be noted that additional chamber temperature ranges, such as temperature ranges comprising less than approximately 20.0° C. and greater than approximately 400.0° C. are possible, and claimed subject matter is not limited in this respect.

As shown in FIG. 3B, (embodiment 350) after exposure of conductive substrate 210 to a gaseous precursor, such as a gaseous precursor comprising $(Ni(Cp)_2)$, the chamber may be purged of remaining gaseous $Ni(Cp)_2$ and/or Cp ligands. In an embodiment, for the example of a gaseous precursor comprising $(Ni(Cp)_2)$, the chamber may be purged for duration approximately in the range of 0.5 seconds to 180.0 seconds. In one or more embodiments, a purge duration may depend, for example, on affinity (aside from chemical bonding) of unreacted ligands and byproducts with a transition metal, transition metal compounds, transition metal oxides, or the like.

As shown in FIG. 3B, in particular embodiments, responsive to purging a chamber of excess gaseous precursor, such as unreacted $Ni(Cp)_2$, a single layer of $Ni(Cp)_2$ may remain deposited on substrate 210. In certain embodiments, after the chamber has been purged, ultraviolet light source 360 may be activated, as indicated by hv in FIG. 3B. In this context, ultraviolet light source 360 refers to an illumination source having output energy that predominantly (greater than approximately 50.0% of total output energy) comprises ultraviolet frequency content. In this context, the term "ultraviolet frequency content" refers to radiant energy at ultraviolet or near-ultraviolet wavelengths of between approximately 100.0 and 450.0 nm. Thus, an example ultraviolet light source may comprise a low-pressure mercury lamp that emits a substantial portion of energy at a wavelength of approximately 253.7 nm and 184.9 nm. It should be noted, however, that ultraviolet light source 360 may provide ultraviolet energy at additional wavelengths, such as 264.0 nm, 313.2 nm 365.0 nm, 405.0 nm, and 436 nm, and claimed subject matter is not limited in this respect. In the embodiment of FIG. 3B, ultraviolet light source 360 may emit energy at an output power level sufficient to break at least some chemical bonds between Ni and attached Cp ligands. Thus, as shown in FIG. 3B, attached Cp ligands may become disassociated from Ni atoms (as indicated by the T arrows) responsive to exposure to ultraviolet light source 360.

In particular embodiments, exposure to ultraviolet light source 360, as indicated by hv in FIG. 3B, may give rise to disassociation of Cp ligands from Ni atoms utilizing a relatively low chamber temperature, as indicated by the descriptor T↓ in FIG. 3B. In certain embodiments, as mentioned previously herein, disassociation of Cp ligands of a CEM film 220 may occur in a presence of an ultraviolet light source in a chamber approximately in the range of 20.0° C. to 350.0° C. At such chamber temperatures, atomic and molecular components of substrate 210 may be unlikely to diffuse from substrate 210 and into CEM film 220.

As shown in FIG. 3C, (embodiment 375) forming a CEM film on a substantially complete conductive substrate, such as substrate 210, may involve exposure to a second gaseous precursor, such as precursor BY of expression (6). As previously mentioned, a second gaseous precursor may comprise an oxidizer, which may operate to displace a first ligand, such as Cp, for example, and replace the first ligand with oxygen (O*), nitrogen (N), or carbonyl (CO), just to name a few examples. In embodiments, exposure of Cp ligands to ultraviolet light source 360 may operate to accelerate the relatively low-temperature disassociation of Cp ligands from Ni atoms so as to form a single layer of an NiO CEM film. Accordingly, a temperature of a process chamber, into which a second gaseous precursor may flow, may remain relatively low, such as at a temperature approximately in the range of 20.0° C. to 350.0° C., for example.

Thus, in particular embodiments, activation of ultraviolet light source 360 in the presence of a second, oxidizing precursor gas comprising ozone $(O_3)$, which may bring about formation of one or more layers of a CEM film at a lower temperature, may be expressed in expression (7), below:

$$hv + Ni(CP)_2 + O_3 \rightarrow NiO + O_2 \qquad (7)$$

In which expression (7) indicates that an addition of ultraviolet energy (hv) to $Ni(CP)_2 + O_3$ may give rise to formation of an NiO layer of a CEM film. Further, in embodiments utilizing an oxidizing precursor gas comprising molecular oxygen, activation of an ultraviolet light source may also accelerate formation of one or more layers of the CEM film, as expressed in expression (8), below:

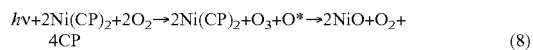

$$hv + 2Ni(CP)_2 + 2O_2 \rightarrow 2Ni(CP)_2 + O_3 + O^* \rightarrow 2NiO + O_2 + 4CP \qquad (8)$$

It should be noted, however, that activation of an ultraviolet light source may give rise to formation of a number of additional unreacted gases, and claimed subject matter is not limited in this respect. FIG. 3C, for example, shows a number of precursor products in gaseous form, such as $O_2$, $O_3$, and oxygen radicals indicated by O*.

Although FIGS. 3A-3C are directed toward an atomic layer deposition process utilizing ultraviolet light sources in an approach to form layers of a CEM film, other embodiments may utilize, for example, chemical vapor deposition, spin-on deposition, and so forth, which may benefit from exposure to ultraviolet light in one or more steps of the fabrication process. It should be noted, however, that exposure to ultraviolet light may provide additional benefits, such as filling oxygen vacancies, described in reference to FIGS. 4A and 4B, so as to maintain desirable properties of rapid conductor-to-insulator switching and insulator-to-conductor switching in a CEM device.

In particular embodiments, use of an ultraviolet light source may also enhance plasma-based deposition processes used in fabricating a CEM film. In a plasma-based deposition process, in which an ultraviolet light source is not employed, ionized gaseous precursors may flow into a fabrication chamber to form one or more layers of a CEM. However, in some instances, if an ultraviolet light source is not present, a plasma-based deposition process may bring about a CEM film comprising relatively low densities of $NiO:CO$ or $NiO:NH_3$, for example, and relatively high defect rates. For example, in some embodiments, plasma-based deposition of CEM films may give rise to an increase in oxygen vacancies in materials utilized to form CEM films.

Figure 4A:
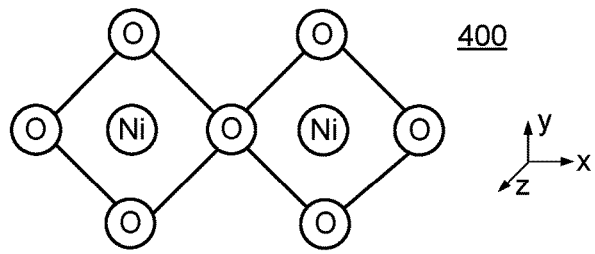
FIG. 4A is an illustration of a representative nickel oxide (NiO) complex of a correlated electron material according to an embodiment.

As an example, FIG. 4A is an illustration of a representative NiO complex of a correlated electron material according to an embodiment 400. Although nickel atoms in FIG. 4A are indicated as being situated among four oxygen atoms oriented in an X-Y plane, oxygen atoms of a NiO complex may, at least in particular embodiments, be situated between two additional nickel atoms oriented in the Z-Y plane of FIG. 4A, for example. In embodiments, NiO complexes, such as shown in FIG. 4A, may be arranged to form amorphous NiO, crystalline NiO, or polycrystalline NiO, for example.

Figure 4B:
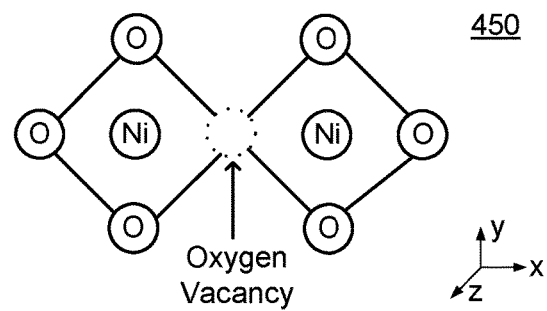
FIG. 4B is an illustration of a representative oxygen vacancy in a NiO complex of a correlated electron material according to an embodiment.

FIG. 4B is an illustration of a representative embodiment 450 of an oxygen vacancy in a NiO complex of a correlated electron material. As previously mentioned, such defects, which may include oxygen vacancy 410, for example, may be more prevalent during particular deposition processes, such as plasma-based deposition of CEM films that do not benefit from exposure to an ultraviolet light source. Defects, such as oxygen vacancy 410, may bring about a degradation in electron back-donation of a CEM material. In turn, a degradation in electron back-donation in a CEM material may give rise to a decrease in conductivity of a CEM-based device, an increase in charge storage within a CEM-based device (which may increase parasitic capacitance and, consequently, decrease high-frequency switching performance), and/or may degrade other performance aspects of a CEM-based device, and claimed subject matter is not limited in this respect.

Figure 4C:
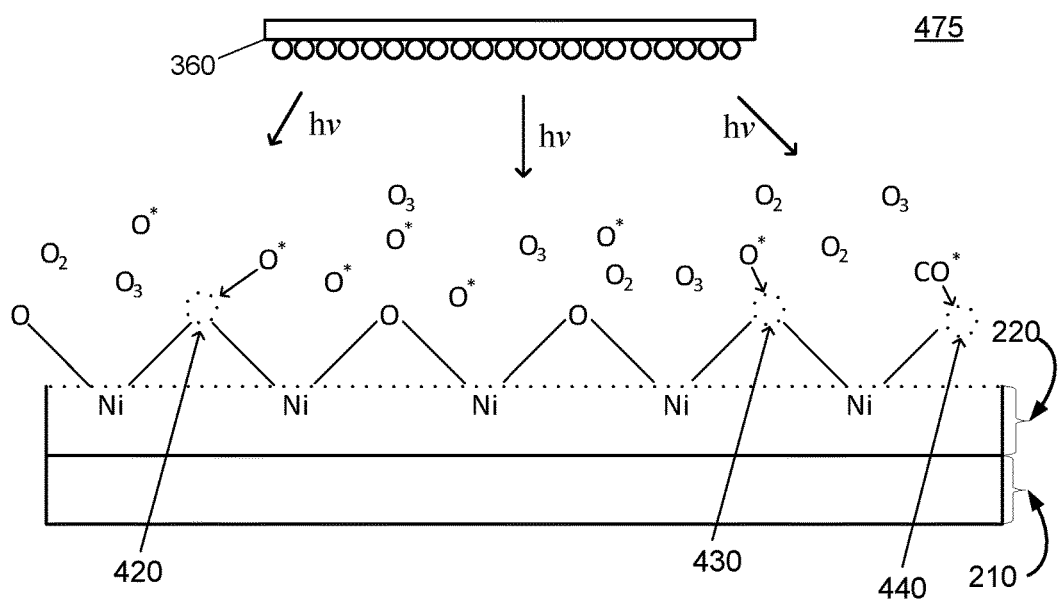
FIG. 4C illustrates an embodiment of a sub-process utilized to fill an oxygen vacancy of the NiO complex of FIG. 4B.

FIG. 4C illustrates an embodiment 475 of a sub-process utilized to fill an oxygen vacancy of the NiO complex of FIG. 4B. The sub-process of FIG. 4C may comprise a post-deposition approach toward filling oxygen vacancies in a CEM film, such as CEM film 220, which may be fabricated on conductive substrate 210. In particular embodiments, the sub-process of FIG. 4C may occur substantially in accordance with expression (9), below:

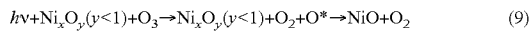

$$hv + Ni_xO_y(y<1) + O_3 \rightarrow Ni_xO_y(y<1) + O_2 + O^* \rightarrow NiO + O_2 \quad (9)$$

In expression (9) the constraint of and y<1 are to indicate a presence of oxygen vacancies in an NiO amorphous, crystalline, or polycrystalline CEM. For example, the NiO complex of FIG. 4B, in which oxygen vacancy 410 is present, may represent an instance for which y<1. This may be contrasted the NiO complex of FIG. 4A, in which no oxygen vacancies are shown (e.g., y=1).

In accordance with expression (9), during a post-deposition annealing process, $O_3$ (ozone) may flow into an annealing chamber. During exposure of CEM film 220 to $O_3$, ultraviolet light source 360 may be activated so as to introduce ultraviolet energy (symbolized by hv in expression (9)). In embodiments, responsive to exposure of $O_3$ to a light source having predominantly ultraviolet frequency content, such as ultraviolet light source 360, $O_3$ may disassociate to produce atomic oxygen (O*) and molecular oxygen ($O_2$). Thus, as shown in the embodiment of FIG. 4C, atomic oxygen (O*) may fill oxygen vacancies, such as at oxygen vacancies 420 and 430, for example, in a NiO-based CEM film. Responsive to filling oxygen vacancies, a CEM film may exhibit favorable electrical properties, such as, for example, rapid and reversible conductor-to-insulation switching.

In particular embodiments, use of ultraviolet light source 360, such as shown and described in relation to FIG. 4C, may be utilized in the presence of gaseous carbonyl (CO), which may operate to ionize CO, thus providing a more reactive form of CO, which may be indicated as CO*. A more reactive form of CO (e.g., CO*) may be more likely to attach to an oxygen vacancy of a NiO complex, such as shown in FIG. 4C, in which CO* is shown attaching to Ni to fill oxygen vacancy 440. As previously described herein, CO may operate as a dopant in a CEM-based device to enhance controllable and reversible electron back-donation, which may bring about rapid, controllable, and reversible conductor-to-insulator switching.

Figure 5:
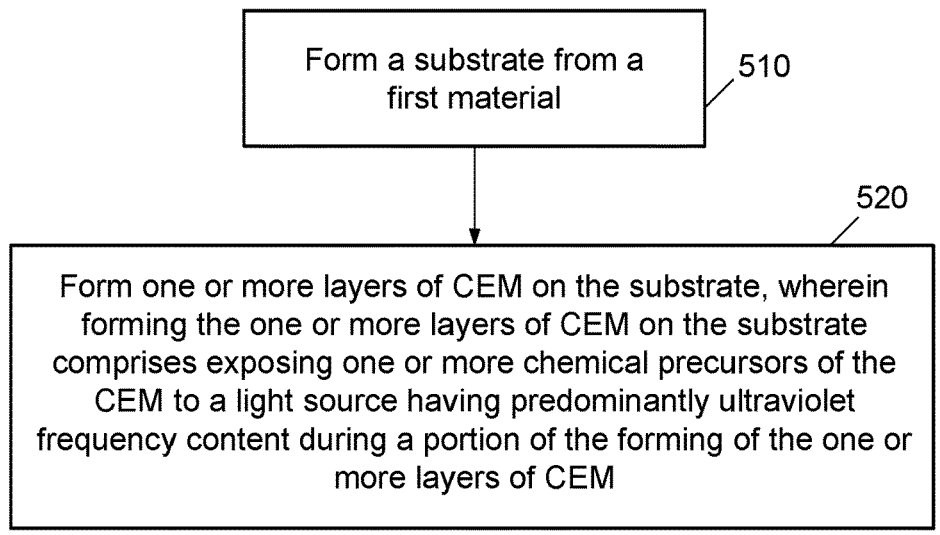
FIGS. 5-7 are flowcharts of embodiments for generalized processes for fabricating correlated electron materials via exposure to an ultraviolet light source.

FIG. 5 is a flowchart of an embodiment for a generalized process for fabricating correlated electron materials via exposure to ultraviolet light. Example implementations, such as described in FIG. 5, and other figures described herein, may include blocks in addition to those shown and described, fewer blocks, or blocks occurring in an order different than may be identified, or any combination thereof. The method may begin at block 510, which may comprise forming a substrate from a material such as TiN, for example. In other embodiments, however, a substrate may comprise platinum, tantalum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof. A substrate formed at block 510 may involve a variety of processes, such as atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition or the like, utilized in fabrication of CEM devices.

The method may continue at block 520, which may comprise forming one or more layers of CEM on the substrate, wherein forming the one or more layers of CEM on the substrate comprises exposing one or more chemical precursors of the CEM to a light source having predominantly ultraviolet frequency content during a portion of the forming of the one or more layers of CEM.

Figure 6:
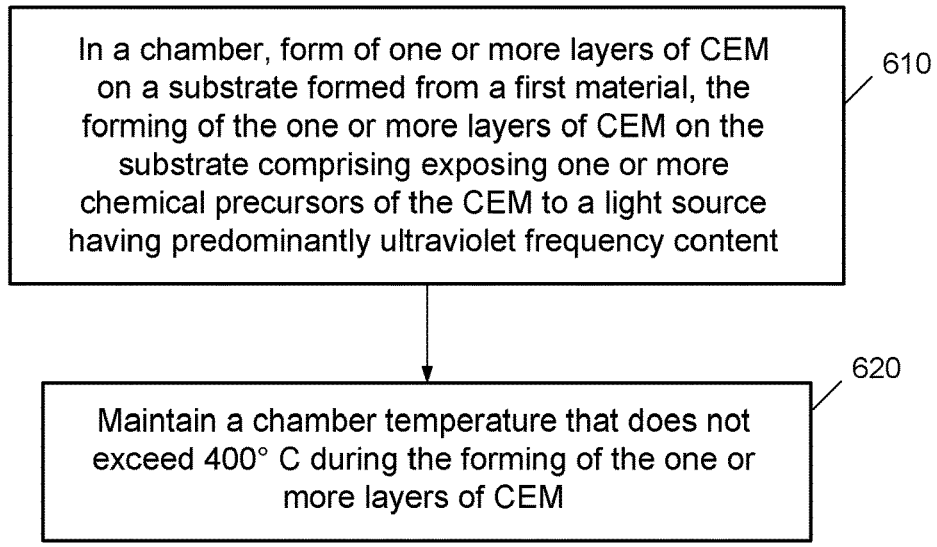

FIG. 6 is a flowchart for a generalized process for fabricating correlated electron materials via exposure to ultraviolet light. The method may begin at block 610, which may comprise forming one or more layers of CEM on a substrate formed from a first material, such as a conductive material. Block 610 may comprise forming, in a chamber, one or more layers of CEM on a substrate formed from a first material. At block 610, the forming of the one or more layers of CEM on the substrate may comprise exposing one or more chemical precursors of the CEM to a light source having predominantly ultraviolet frequency content. The method may continue at block 620, which may comprise maintaining a chamber temperature that does not exceed 400.0° C. during the forming of the one or more layers of the CEM.

Figure 7:
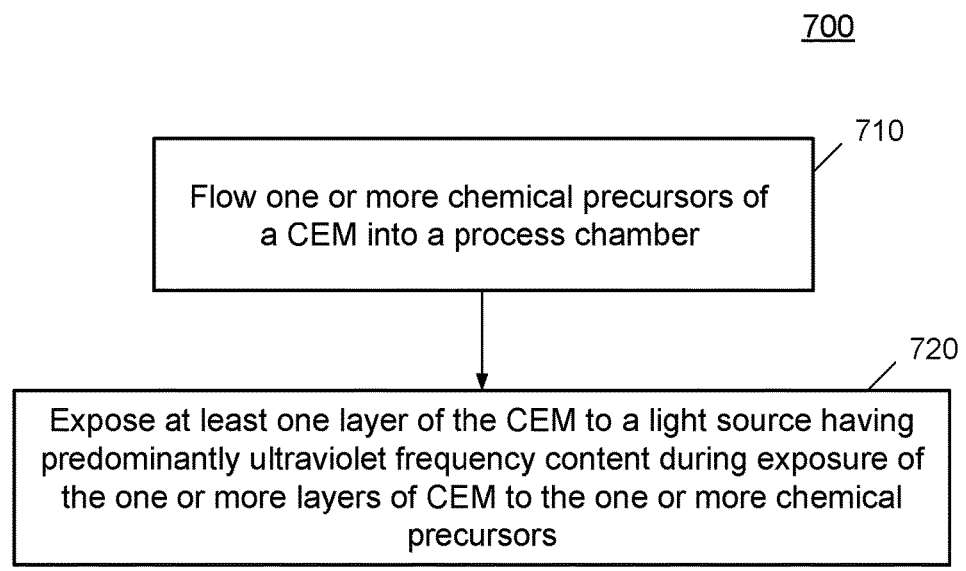

FIG. 7 is a flowchart for a generalized process for fabricating correlated electron materials via exposure to ultraviolet light. The method may begin at block 710, which may comprise flowing one or more chemical precursors of a CEM into a process chamber. Block 720 may comprise exposing at least one layer of the CEM to a light source having predominantly ultraviolet frequency content during exposure of the one or more layers of CEM to the one or more chemical precursors.

In an embodiment, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a device, comprising:
   forming a substrate from a first material; and
   forming, in a chamber, one or more layers of correlated electron material (CEM) on the substrate via an atomic layer deposition process comprising a plurality of individual cycles, wherein forming at least one of the one or more layers in an individual cycle of the plurality of individual cycles comprises:
   purging the chamber of at least a portion of a particular precursor gas used in forming at least one layer of the one or more layers of CEM; and
   following initiation of the purging, commencing exposure of the at least one layer of the one or more layers of CEM to a light source having predominantly ultraviolet frequency content prior to a flooding of the chamber with a subsequent precursor gas in a subsequent cycle of the plurality of individual cycles.

2. The method of claim 1, wherein the at least one layer of the one or more layers of CEM comprises a thickness of about 0.6 Å to about 5.0 Å.

3. The method of claim 1, wherein the particular precursor gas comprises nickel amidinate (Ni(AMD)), nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni(CH$_3$C$_5$H4)$_2$), nickel dimethylglyoximate (Ni(dmg)2), nickel 2-amino-pent-2-en-4-onato (Ni(apo)$_2$), Ni(dmamb)$_2$ (in which dmamb=1-dimethylamino-2-methyl-2-butanolate), Ni(dmamp)$_2$ (in which dmamp=1-dimethylamino-2-methyl-2-propanolate), Bis(pentamethylcyclopentadienyl)nickel (Ni(C$_5$(CH$_3$)$_5$)$_2$) or nickel carbonyl (Ni(CO)$_4$), or any combination thereof, in a gaseous state.

4. The method of claim 2, wherein the light source emits a substantial portion of energy at a wavelength of approximately 253.7 nm and 184.9 nm.

5. The method of claim 2, further comprising:
   maintaining the chamber at a temperature of between about 20.0° C. and about 400.0° C.

6. The method of claim 1, wherein the atomic layer deposition process utilizes at least the particular precursor gas and the subsequent precursor gas to deposit components of NiO:CO over the substrate.

7. The method of claim 1, wherein the atomic layer deposition process utilizes at least the particular precursor gas and the subsequent precursor gas to deposit components of NiO:NH$_3$ onto the substrate.

8. The method of claim 1, wherein forming the one or more layers of CEM comprises a thermally-sensitive portion, the thermally-sensitive portion occurring at a chamber temperature of less than 400.0° C.

9. The method of claim 1, wherein the light source having predominantly ultraviolet frequency content comprises a light source emitting energy, wherein at least 50% of the emitted energy comprises energy at wavelengths of between approximately 100.0 nm and 450.0 nm.

10. A method of constructing a device, comprising:
    in a chamber, forming, via an atomic layer deposition process comprising a plurality of individual cycles, one or more layers of correlated electron material (CEM) on a substrate formed from a first material, wherein forming at least one layer of the one or more layers in an individual cycle of the plurality of individual cycles comprises exposing one or more particular chemical precursors of the CEM to a light source having predominantly ultraviolet frequency content, the exposing following purging the chamber of at least a portion of a gaseous precursor prior to a flooding of the chamber with one or more subsequent chemical precursors in a subsequent cycle of the plurality of individual cycles; and
    maintaining a temperature of the chamber that does not exceed 400.0° C. during the forming the one or more layers of CEM.

11. The method of claim 10, wherein the at least one layer of the one or more layers of CEM comprises a thickness of about 0.6 Å to about 5.0 Å.

12. The method of claim 11, wherein the one or more particular chemical precursors comprises nickel amidinate (Ni(AMD)), nickel dicyclopentadienyl (Ni(Cp)$_2$), nickeldiethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni(CH$_3$C$_5$H4)$_2$), nickel dimethylglyoximate (Ni(dmg)2), nickel 2-amino-pent-2-en-4-onato (Ni(apo)$_2$), Ni(dmamb)$_2$ (in which dmamb=1-dimethylamino-2-methyl-2-butanolate), Ni(dmamp)$_2$ (in which dmamp=1-dimethylamino-2-methyl-2-propanolate), Bis(pentamethylcyclopentadienyl)nickel (Ni(C$_5$(CH$_3$)$_5$)$_2$) or nickel carbonyl (Ni(CO)$_4$), or any combination thereof, in a gaseous state.

13. The method of claim 11, wherein the light source emits a substantial portion of energy at a wavelength of approximately 253.7 nm and 184.9 nm.

14. The method of claim 11, further comprising:
maintaining the chamber at a temperature between about 20.0° C. and about 400.0° C.

15. The method of claim 10, wherein the atomic layer deposition processes utilizes at least the one or more particular chemical precursors and the one or more subsequent chemical precursors to deposit components of NiO:CO over the substrate.

16. The method of claim 10, wherein the atomic layer deposition process utilizes at least the one or more particular chemical precursors and the one or more subsequent chemical precursors to deposit components of NiO:$NH_3$ onto the conductive substrate.

17. A method of fabricating a device, comprising:
flowing one or more chemical precursors of a correlated electron material (CEM) into a process chamber during an individual cycle of a plurality of individual cycles of an atomic layer deposition process; and
exposing, following purging of the process chamber of at least a portion of a particular precursor gas used in forming at least one layer of one or more layers in an individual cycle of the plurality of individual cycles, one or more layers of the CEM to a light source having a predominantly ultraviolet frequency content prior to a flooding of the chamber with a subsequent precursor gas in a subsequent cycle of the plurality of individual cycles.

18. The method of claim 17, further comprising:
forming a substrate prior to the flowing of the one or more chemical precursors of the CEM, the CEM being formed on one or more layers of the substrate.

19. The method of claim 17, further comprising:
maintaining a temperature of the process chamber below 400.0° C.

20. The method of claim 17, wherein the flowing the one or more chemical precursors comprises flowing nickel amidinate (Ni(AMD)), nickel dicyclopentadienyl (Ni$(Cp)_2$), nickel diethylcyclopentadienyl (Ni$(EtCp)_2$), Bis(2,2,6,6-tetramethylheptane-3,5-dionato)Ni(II) (Ni$(thd)_2$), nickel acetylacetonate (Ni$(acac)_2$), bis(methylcyclopentadienyl) nickel (Ni$(CH_3C_5H4)_2$), nickel dimethylglyoximate (Ni(dmg)2), nickel 2-amino-pent-2-en-4-onato (Ni$(apo)_2$), Ni$(dmamb)_2$ (in which dmamb=1-dimethylamino-2-methyl-2-butanolate), Ni$(dmamp)_2$ (in which dmamp=1-dimethylamino-2-methyl-2-propanolate), Bis(pentamethylcyclopentadienyl)nickel (Ni$(C_5(CH_3)_5)_2$) or nickel carbonyl (Ni$(CO)_4$), or any combination thereof, in a gaseous state.

21. The method of claim 17, wherein the at least one layer of the one or more layers of the CEM comprises a thickness of about 0.6 Å to about 5.0 Å.

* * * * *